US009123586B2

(12) United States Patent
Choi et al.

(10) Patent No.: US 9,123,586 B2
(45) Date of Patent: Sep. 1, 2015

(54) ARRAY SUBSTRATE, METHOD FOR FABRICATING THE SAME AND DISPLAY DEVICE

(71) Applicant: BOE TECHNOLOGY GROUP CO., LTD., Beijing (CN)

(72) Inventors: Seungjin Choi, Beijing (CN); Seongyeol Yoo, Beijing (CN); Youngsuk Song, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 116 days.

(21) Appl. No.: 13/964,610

(22) Filed: Aug. 12, 2013

(65) Prior Publication Data

US 2014/0042540 A1    Feb. 13, 2014

(30) Foreign Application Priority Data

Aug. 13, 2012 (CN) .......................... 2012 1 0286786

(51) Int. Cl.
| | |
|---|---|
| *H01L 29/66* | (2006.01) |
| *H01L 27/12* | (2006.01) |
| *H01L 29/417* | (2006.01) |
| *H01L 29/423* | (2006.01) |
| *H01L 29/786* | (2006.01) |

(52) U.S. Cl.
CPC ........ *H01L 27/1214* (2013.01); *H01L 27/1262* (2013.01); *H01L 27/1288* (2013.01); *H01L 29/41733* (2013.01); *H01L 29/42384* (2013.01); *H01L 29/78603* (2013.01)

(58) Field of Classification Search
CPC ................ H01L 29/66; H01L 29/6675; H01L 29/66765; H01L 29/786; H01L 29/78669; H01L 29/78618
USPC .................. 257/40, 57, 66, 347–349, E21.414
See application file for complete search history.

(56) References Cited

U.S. PATENT DOCUMENTS

| | | | | |
|---|---|---|---|---|
| 6,064,091 | A * | 5/2000 | Deane et al. .................. | 257/347 |
| 2005/0258487 | A1 | 11/2005 | Suh et al. | |
| 2008/0149921 | A1* | 6/2008 | Choi et al. ...................... | 257/40 |
| 2011/0269274 | A1* | 11/2011 | Furuta et al. .................. | 438/158 |
| 2013/0126869 | A1* | 5/2013 | Kanegae et al. ................ | 257/57 |

FOREIGN PATENT DOCUMENTS

| | | |
|---|---|---|
| CN | 1783515 A | 6/2006 |
| JP | 5-944871 A | 3/1984 |
| JP | 2007-173307 A | 7/2007 |

OTHER PUBLICATIONS

First Chinese Office Action dated Jun. 5, 2014; Appln. No. 201210286786.9.

\* cited by examiner

*Primary Examiner* — Michael Lebentritt
(74) *Attorney, Agent, or Firm* — Ladas & Parry LLP

(57) ABSTRACT

Disclosed are an array substrate, a method for fabricating the same and a display device. The array substrate comprises: a substrate, a gate electrode, a gate insulating layer as well as an active layer, and a source/drain metal layer formed on the substrate, the source/drain metal layer is configured for forming a source electrode, a drain electrode and a channel region, wherein a region of the S/D metal layer for forming the channel region is at a lower height than other region of the S/D metal layer for forming the source electrode and the drain electrode.

8 Claims, 2 Drawing Sheets

US 9,123,586 B2

ARRAY SUBSTRATE, METHOD FOR FABRICATING THE SAME AND DISPLAY DEVICE

FIELD OF THE ART

Embodiments of the invention relate to the field of display technologies, more particularly, to an array substrate, a method for fabricating the same and a display device.

BACKGROUND

The Gate Driver on Array (GOA) technology integrates a Thin Film Transistor (TFT) working as a gate switch circuit on an array substrate, thereby saving the gate driving IC and reducing product cost in terms of material cost and process steps.

A GOA-based gate switch circuit TFT is generally formed on the array substrate at the same time with TFTs in pixel regions. Moreover, TFTs of various sizes are formed in the GOA element. TFTs of various sizes specifically refer to the formed TFTs having channels of different sizes. In a source/drain tied (SDT) device (that is a semiconductor active layer and a source/drain electrode layer are formed through a single patterning process), transmittance of a Half Tone Mask (HTM) used in an ashing process for the source/drain electrode is varied according to the TFT size. Variation in the transmittance of the HTM causes TFT channel locations to have different photoresist thickness during the ashing process, which eventually will break TFT channel regions having relatively thin photoresist after the subsequent etching is done and leave the TFTs open-circuited.

As shown in FIGS. 1 and 2, configurations of two bottom gate TFTs are schematically illustrated. The two TFTs have similar configuration and are formed according to the same procedure which comprises the steps of sequentially forming a gate electrode P2, a gate insulating layer (not shown in the figures), an active layer P3 as well as a source/drain (S/D) metal layer P4 on a substrate P1 from the bottom up, then forming a channel region using HTM technology, that is, forming a first photoresist P5 on the S/D metal layer P4, after being exposed and developed using the HTM, forming a first photoresist aperture region P6 above the S/D metal layer P4 at a position where the channel region to be formed. A part of the photoresist leaves in the aperture region P6. However, photoresist in the first photoresist aperture region of the TFT structure in FIG. 1 has a thickness of h1, while photoresist in the first photoresist aperture region of the TFT structure in FIG. 2 has a thickness of h2, and h1<h2. Since hl is relatively small, the photoresist can not completely protect the source/drain metal layer in the channel region of FIG. 1. Specifically, in FIG. 1, when the left photoresist in the first photoresist aperture region P6 is exposed and developed to form a source electrode and a drain electrode, the thickness of the photoresist in the aperture region P6 is reduced to a certain extent. When the photoresist is further exposed, developed and etched to form the channel region, the active layer P3 will be partly etched due to the photoresist is relatively thin. When channel region is fanned for the TFT of FIG. 1, the actively layer is partly etched, which will cause the channel region to break; as a result, the TFT switch is open-circuited and a defect is generated.

FIG. 5 schematically illustrates a configuration of a top-gate TFT which is similar to the configuration illustrated in FIG. 1. In the TFT, a channel region is also easily broken due to a photoresist in a first photoresist aperture region P6' above a S/D metal layer P4' for forming the channel region has a relatively small thickness h1, which will make the TFT switch open-circuited and cause a defect.

SUMMARY

In one aspect, the invention provides an array substrate comprising a substrate, a gate electrode, a gate insulating layer as well as an active layer and a source/drain metal layer formed on the substrate, the source/drain metal layer is configured for forming a source electrode, a drain electrode and a channel region, wherein a region of the S/D metal layer for forming the channel region is at a lower height than other region of the S/D metal layer for forming the source electrode and the drain electrode.

As an example, a groove-shaped gate aperture region is formed in the gate electrode below the channel region.

As an example, a groove-shaped substrate aperture region is formed in the substrate below the channel region.

As an example, the gate aperture region is formed through a patterning process.

As an example, a depth of the gate aperture region is about 100 Å~2000 Å.

As an example, the substrate aperture region is formed through laser irradiation or a photolithography process.

As an example, a depth of the substrate aperture region is about 100 Å~2000 Å.

In another aspect, the invention further provides a method for forming a substrate, the method comprises steps of:

forming a gate electrode metal layer on a substrate and forming a pattern of a gate electrode and a gate aperture region through a patterning process;

sequentially forming a gate insulating layer, an active layer, a source/drain electrode and a pixel electrode on the substrate with the gate electrode formed thereon.

As an example, the step of faulting a gate metal layer on a substrate and forming a pattern of a gate electrode and a gate aperture region through a patterning process comprises:

forming a gate electrode metal layer on the substrate and forming a photoresist on the gate electrode metal layer, exposing and developing the photoresist using a dual-tone mask to form a photoresist-completely-removed region corresponding to other region except the gate electrode to be formed, a photoresist-partially-removed region for forming the gate aperture region and corresponding to the TFT channel, and a photoresist-completely-remained region corresponding to remaining region;

etching the gate electrode metal layer in the photoresist-completely-removed region to form the gate electrode; completely removing the photoresist in the photoresist-partially-removed region and partially retaining the photoresist in the remaining region through an ashing process; and partially etching the gate electrode metal layer exposed in the photoresist-partially-removed region to form the gate electrode aperture region;

peeling remaining photoresist on the gate electrode.

In still another aspect, the invention further provides a display device comprising any of the above array substrate

BRIEF DESCRIPTION OF THE DRAWINGS

In order to clearly illustrate the technical solution of the embodiments of the invention, the drawings of the embodiments will be briefly described in the following; it is obvious that the described drawings are only related to some embodiments of the invention and thus are not limitative of the invention.

Where, P1, P1', 1: substrate; P2, 2: gate electrode; 2-1: gate electrode metal layer; P3, 3: gate insulating layer and active layer; P4, P4', 4: S/D metal layer; P5, P5', 5: first photoresist; P6, P6', 6: first photoresist aperture region; 7: gate aperture region; 8: second photoresist; 9: substrate aperture region; h1, h2: thickness of photoresist in the first photoresist aperture region.

DETAILED DESCRIPTION

In order to make objects, technical details and advantages of the embodiments of the invention apparent, the technical solutions of the embodiment will be described in a clearly and fully understandable way in connection with the drawings related to the embodiments of the invention. It is obvious that the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at lease one. The terms "comprises," "comprising," "includes," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

Embodiment 1

Figure 1:
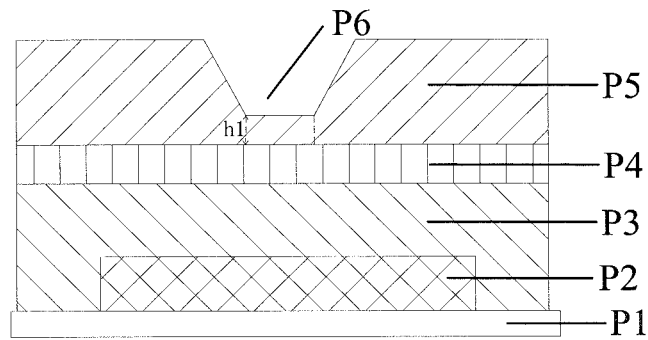
FIG. 1 schematically illustrates a configuration of a conventional TFT.
Figure 2:
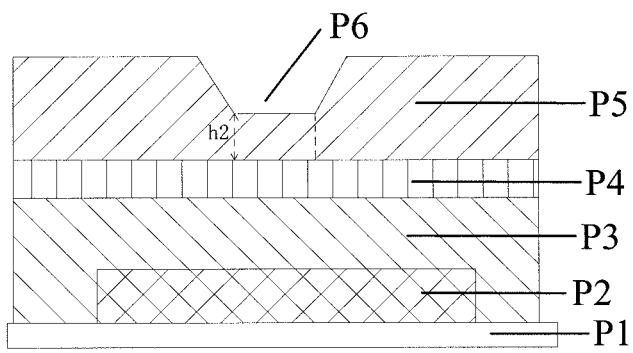
FIG. 2 schematically illustrates a configuration of another conventional TFT.
Figure 3:
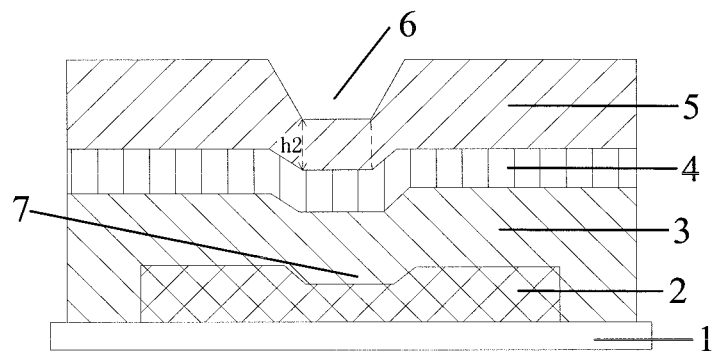
FIG. 3 schematically illustrates a configuration of an array substrate in accordance with Embodiment 1 of the invention.

The embodiment provides an array substrate. FIG. 3 schematically illustrates a configuration of a TFT switch in the array substrate, which comprises a gate electrode 2, a gate insulting layer as well as an active layer 3 (as the gate insulating layer and the active layer are not depicted separately in the figures, they are collectively referred to as reference numeral "3" in context) and a S/D metal layer 4 sequentially formed on a substrate 1 from the bottom up. The S/D metal layer 4 is configured for forming a source electrode, a drain electrode and a channel region, and a region of the S/D metal layer 4 for forming the channel region is at a lower height than other region of the S/D metal layer 4 for forming the source electrode and the drain electrode relative to the substrate 1. That is to say, a level difference is formed on the S/D metal layer 4. In this case, when the channel region is subsequently formed, a thickness of a photoresist left in a first photoresist aperture region 6, which is formed after exposing and developing a first photoresist 5 above a region for forming the channel region on the S/D metal layer 4 using the HTM, is accordingly increased, which can prevent the channel region from breaking when being further etched and avoid a defect.

As an example, as illustrated in FIG. 3, a groove-shaped gate aperture region 7 may be further formed in a region of the gate electrode 2 corresponding to the channel region, thereby causing a level difference in the gate electrode 2. Such a level difference further cause level differences for all of the gate insulating layer as well as the active layer 3 and the S/D metal layer 4 formed on the gate electrode 2 from the bottom up, which can meet the objective of accordingly increasing the thickness h2 of the photoresist left in the first photoresist aperture region 6.

Figure 4:
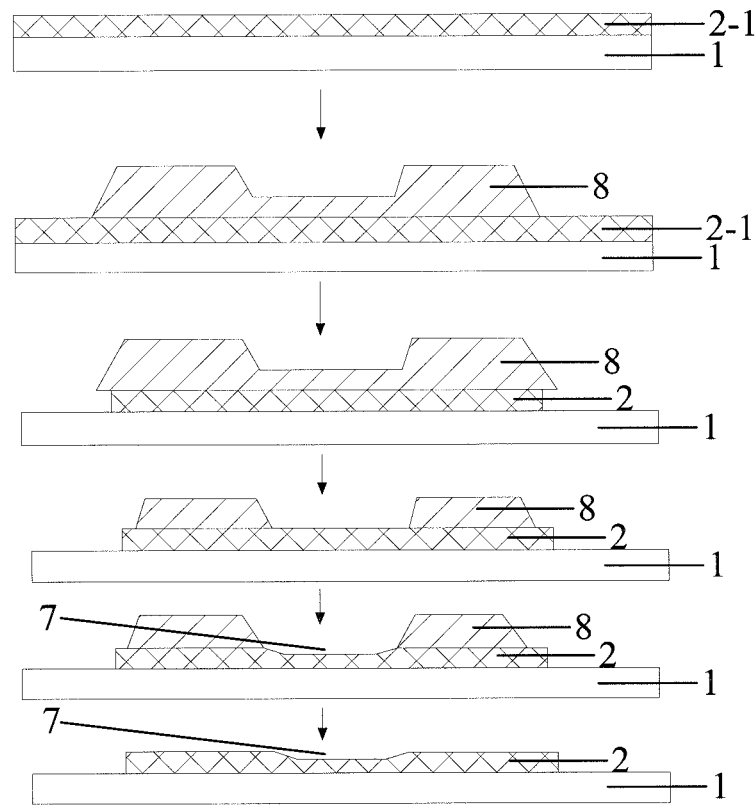
FIG. 4 schematically illustrates a procedure for forming a gate electrode of the array substrate in accordance with Embodiment 1 of the invention.
Figure 5:
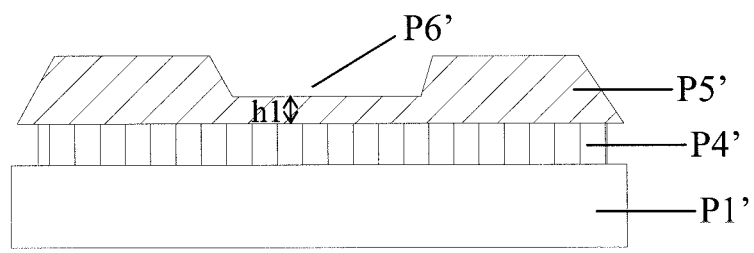
FIG. 5 schematically illustrates a configuration of a further conventional TFT.

As an example, a procedure for forming the gate electrode 2 with the gate electrode aperture region 7 on the substrate 1 is illustrated in FIG. 4, in which:

S1: forming a gate electrode metal layer on a substrate and forming a pattern of a gate electrode and a gate electrode aperture region through a patterning process.

As an example, a gate electrode metal layer 2-1 is first formed on the substrate 1, and then a second photoresist 8 is formed on the gate electrode metal layer 2-1. The second photoresist 8 is then exposed and developed using the HTM to form a photoresist-completely-removed region corresponding to other region except the gate electrode 2 to be formed, a photoresist-partially-removed region for forming the gate aperture region 7 and corresponding to the TFT channel, and a photoresist-completely-remained region corresponding to remaining region. Next, the gate electrode metal layer 2-1 not covered by the second photoresist 8 (i.e. in the photoresist-completely-removed region), is etched to form the gate electrode 2. An ashing process is then used to completely remove the second photoresist 8 in the region for forming the gate electrode aperture region 7 (i.e. in the photoresist-partially-removed region), while second photoresist 8 in other regions on the gate electrode 2 is partially retained. The gate electrode metal layer 2-1 exposed in the photoresist-partially-removed region is then partially etched to form the gate electrode aperture region 7. Finally, remaining photoresist on the gate electrode 2 is peeled.

S2: sequentially forming a gate insulating layer, an active layer, a S/D electrode and a pixel electrode on the substrate obtained in step S1. As an example, conventional methods known in the field may be used to form the S/D electrode, the pixel electrode, the active layer, and the gate insulating layer.

In the embodiment, a depth of gate aperture region 7 is for example about 100 Å~2000 Å, such that the thickness of the photoresist in the region of the subsequently formed S/D metal layer 4 for forming the channel region is thickened approximately by 100 Å~2000 Å, thus preventing the thickness being too small from affecting the formation of the channel region.

Optionally, other than forming the gate electrode aperture region 7 on the gate electrode 2, a substrate aperture region 9 similar to the gate electrode aperture region 7 may also be formed on the substrate 1. The substrate aperture region 9 may be formed through laser irradiation or a photolithography process. A depth of the substrate aperture region 9 is the same as the gate electrode aperture region 7, for example, about 100 Å~2000 Å. In this way, the level difference in the S/D metal layer 4 can thus be formed similarly, thereby the channel region can be formed without defects.

Embodiment 2

Figure 6:
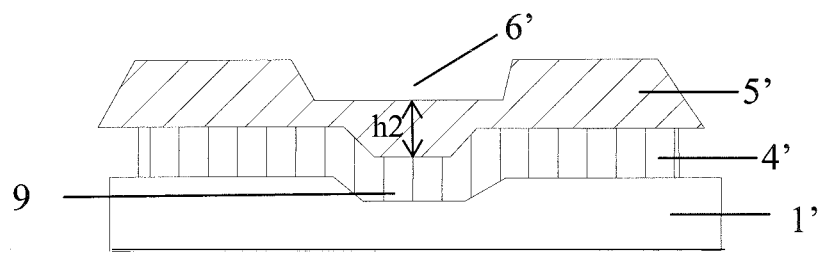
FIG. 6 schematically illustrates a configuration of an array substrate in accordance with Embodiment 2 of the invention.

The TFT in the array substrate of Embodiment 1 is a bottom gate TFT. FIG. 6 further illustrates a schematic configuration of a top gate TFT in an array substrate according to the embodiment. The array substrate of the embodiment comprises a S/D metal layer 4', an active layer as well as a gate insulating layer and a gate electrode (not shown) sequentially formed on a substrate 1' from the bottom up. The S/D metal layer 4' is configured for forming a source/drain electrode and a channel region, and a region of the S/D metal layer 4' for forming the channel region is at a lower height than other region of the S/D metal layer 4' for forming the source electrode and the drain electrode relative to the substrate 1'.

A procedure for forming the array substrate of the embodiment is as follows:

S1: forming a substrate aperture region on a substrate, the substrate aperture region corresponds to a channel region of a TFT on the array substrate.

As an example, with reference to FIG. 6, a groove-shaped substrate aperture region 9 is formed on the substrate 1' such that there is level difference in the substrate 1'. The substrate aperture region 9 corresponds to the TFT channel region, thereby making the S/D metal layer 4 formed on the substrate 1' to have a level difference, rendering a region of the S/D metal layer 4' for forming the channel region is at a lower height than other region of the S/D metal layer 4' for forming the source electrode and the drain electrode relative to the substrate 1'. By this means, during the formation of the channel region, a first photoresist 5' formed on the S/D metal layer 4' is exposed with a dual-tone mask (a half-tone mask (HTM) or a gray-tone mask (GTM)), and a thickness of partially-retained photoresist 5' on the region of the S/D metal layer 4' for forming the channel region, i.e., a thickness h2 of the photoresist 5' in the first photoresist aperture region 6", is accordingly increased, thereby preventing the channel region from breaking during subsequent etching and from generating a defect.

S2: sequentially forming the source/drain electrode, a pixel electrode, a active layer, a gate insulating layer, and a gate electrode on the substrate obtained in step S1. As an example, conventional methods known in the art may be used to form the S/D electrode, the pixel electrode, the active layer, the gate insulating layer and the gate electrode.

In the embodiment, the substrate aperture region 9 may be formed through laser irradiation or a photolithography process. A depth of the substrate aperture region 9 is, for example, about 100 Å~2000 Å, so that the thickness h2 of the photoresist in the first aperture region 6' is increased approximately by 100 Å~2000 Å in comparison with the situation in which no substrate aperture region 9 is formed, thus preventing the thickness being too small from affecting the formation of the channel region.

Embodiment 3

A GOA element and a corresponding display device may be formed according to the above array substrates and the methods for fabricating the same.

The embodiment provides a method for fabricating a GOA element comprising a TFT, where the TFT is fabricated in the same way as those for fabricating the TFTs on the aforedescribed array substrate.

The embodiment further provides a display device comprising the array substrate of Embodiment 1 or 2.

An example of the display device is a liquid crystal display (LCD), where the array substrate is disposed oppose to an opposed substrate for forming a liquid crystal cell and liquid crystal material is filled in the cell. The opposed substrate is for example a color filter substrate. A pixel electrode of each pixel element of the array substrate is configured for applying an electric field to control rotations of the liquid crystal material and thus performing display operation. In some examples, the LCD further comprises a backlight source providing backlight for the array substrate.

Another example of the display device is an organic light emitting device (OLED), where a superimposed layer of organic light emitting materials is formed on the array substrate, and an pixel electrode of each pixel element functions as an anode or a cathode to drive the light emitting material to emit, thereby performing a display operation.

A further example of the display device is an E-paper display device, wherein an e-ink layer is formed on an array substrate, and a pixel electrode of each pixel element applies a voltage for driving charged particles in the e-ink to move so as to perform a display operation.

It is seen from the above embodiments that in the invention a groove-shaped aperture region is formed on the substrate or the gate electrode, thus causing a level difference to be formed in a region corresponding to the aperture region in the gate insulating layer as well as the active layer and the S/D metal layer subsequently formed above. As a result, during the formation of the channel region through the HTM, the thickness of the photoresist covering a region of the S/D metal layer corresponding to the channel region will not be over-thinned due to the relative large transmittance of the HTM, thereby preventing the channel region to break due to the etched thickness of the channel region is too large.

What are described above is related to the illustrative embodiments of the disclosure only and not limitative to the scope of the disclosure; the scopes of the disclosure are defined by the accompanying claims.

What is claimed is:

1. An array substrate comprising:
a substrate,
a gate electrode, a gate insulating layer as well as an active layer, and a source/drain metal layer formed on the substrate, the source/drain metal layer is configured for forming a source electrode, a drain electrode and a channel region, wherein a region of the S/D metal layer for forming the channel region is at a lower height than other region of the S/D metal layer for forming the source electrode and the drain electrode.

2. The array substrate of claim 1, wherein a groove-shaped gate aperture region is formed in the gate electrode below the channel region.

3. The array substrate of claim 1, wherein a groove-shaped substrate aperture region is formed in the substrate below the channel region.

4. The array substrate of claim 2, wherein the gate aperture region is formed through a patterning process.

5. The array substrate of claim 2, wherein a depth of the gate aperture region is about 100 Å~2000 Å.

6. The array substrate of claim 3, wherein the substrate aperture region is formed through laser irradiation or a photolithography process.

7. The array substrate of claim 3, wherein a depth of the substrate aperture region is about 100 Å~2000 Å.

8. A display device comprising the array substrate of claim 1.

* * * * *